United States Patent
Zhang et al.

(10) Patent No.: US 12,021,510 B2
(45) Date of Patent: Jun. 25, 2024

(54) DC OUTPUT SOLID STATE CONTACTOR ASSEMBLY

(71) Applicant: Nominal Controls Inc., Scarborough (CA)

(72) Inventors: Nan Xi Zhang, Kitchener (CA); Zhi Xin Zhang, Scarborough (CA)

(73) Assignee: Nominal Controls Inc., Scarborough (CA)

(*) Notice: Subject to any disclaimer, the term of this patent is extended or adjusted under 35 U.S.C. 154(b) by 0 days.

(21) Appl. No.: 17/671,546

(22) Filed: Feb. 14, 2022

(65) Prior Publication Data

US 2022/0263502 A1  Aug. 18, 2022

Related U.S. Application Data

(60) Provisional application No. 63/149,311, filed on Feb. 14, 2021.

(51) Int. Cl.
  *H03K 17/0814* (2006.01)
  *H01L 23/36* (2006.01)
  *H02H 3/087* (2006.01)
  *H02M 7/00* (2006.01)
  *H03K 17/687* (2006.01)

(52) U.S. Cl.
  CPC ....... *H03K 17/08142* (2013.01); *H01L 23/36* (2013.01); *H02H 3/087* (2013.01); *H02M 7/003* (2013.01); *H03K 17/687* (2013.01)

(58) Field of Classification Search
  None
  See application file for complete search history.

(56) References Cited

U.S. PATENT DOCUMENTS

| | | | | |
|---|---|---|---|---|
| 6,154,369 A | * | 11/2000 | Martinez, Jr. | H01L 23/473 361/719 |
| 6,417,649 B1 | * | 7/2002 | Brink | A61N 1/3981 320/166 |
| 7,187,551 B2 | * | 3/2007 | Fissore | H01L 23/047 361/719 |
| 8,704,409 B2 | * | 4/2014 | Owens | H03K 17/785 307/125 |
| 10,879,878 B1 | * | 12/2020 | Hinnen | H02M 7/06 |
| 2004/0246662 A1 | * | 12/2004 | Thurk | H02M 7/003 361/703 |
| 2012/0026770 A1 | * | 2/2012 | West | H05K 7/20945 361/692 |
| 2015/0311815 A1 | * | 10/2015 | Nedic | H02M 7/003 363/21.01 |
| 2022/0287209 A1 | * | 9/2022 | Reiter | H01L 25/0655 |

* cited by examiner

*Primary Examiner* — Kenneth B Wells
(74) *Attorney, Agent, or Firm* — Miller Thomson LLP

(57) ABSTRACT

In one embodiment, there is provided a DC output solid contactor assembly having a housing enclosure and a cavity within the enclosure; one or more SOT-227 isolated semiconductor modules and its variants in a stand-alone, parallel or series configuration; a novel drive circuit board mounted on at least one of the modules with input power terminals for coupling to an input control source; and gate impulse output terminals coupling to one or more semiconductor's gate electrodes. The drive circuit includes a voltage priming system that converts input control signal to an isolated and optimal gate driving voltage level; and positive and negative output power terminals for coupling to the electrical load side.

16 Claims, 6 Drawing Sheets

DC OUTPUT SOLID STATE CONTACTOR ASSEMBLY

TECHNICAL FIELD

The present disclosure relates generally to the field of electrical relays and breakers, and in particular to a solid state contactor assembly, for making and breaking direct current.

BACKGROUND

Traditional DC output, solid state contactors ("SSCs") employ through-hole/surface mount discrete semiconductor packages with a plurality of straight or staggered leads. Examples of such packages include TO-220, TO-247, TO-263 and their corresponding variants as identified by different prefix and suffix such as TO-220-3. Working with these packages has multiple disadvantages. First, these packages most commonly have a metal tab or a back plate that is not electrically isolated from the internal circuitry. Since DC output SSC will need to mount onto a heatsink, or surface that is electrically conductive, non-isolated, or grounded, this results in the need for the manufacturer to implement an external electrical isolation such as a direct bonded copper ("DBC") substrate. In addition, working with these through-hole/surface mount packages most commonly requires the SSC manufacturer to solder or weld at points of electrical coupling. Both procedures require the need for special equipment, techniques, and processes that can be both difficult and complex to implement.

The second disadvantage of traditional DC output SSC employing through-hole/surface mount semiconductor packages relates to performance limitations. For example, the protoypical DC output SSCs are not rated to switch more than 200 Adc and 150 VDC. For example, the Crydom™ HDC Series™ has a maximum load current of 160 A@150 VDC; and the E-T-A Circuit Breakers™ ERP10 Series™ has a maximum output of 200 A@24 VDC. Such limitations are primarily imposed by the maximum ratings of the through-hole/surface mount packages themselves, including for example, thermal transfer characteristics and maximum safe RMS current carrying capacity of all electrical connections. In the case of SSCs that employ through-hole/surface mount insulated-gate bipolar transistor ("IGBT") packages, maximum performances cannot be increased effectively by connecting more IGBTs in parallel. This is because IGBTs typically have a negative temperature coefficient. Among an array of IGBTs, the ones with lower voltage drop will conduct more current resulting in a higher operating temperature which further reduces their corresponding voltage drop and increases their load current. Given the difficulties with current sharing in a large array of IGBTs, the rated output of an IGBT based DC output solid-state relay would be largely dependent on the package limit of a single IGBT component.

With SSCs that employ through-hole/surface mount metal-oxide semiconductor field-effect transistor ("MOSFET") packages, maximum performance, such as carrying current, may be increased by coupling multiple MOSFET packages in parallel. However, at higher current, this approach may be physically unfeasible owing to the sheer number of through-hole/surface mount MOSFETs required to be coupled together for switching higher current. Moreover, due to inherent variabilities such as ON resistance and breakdown voltages among MOSFETs (of the same model), electrical load is not shared equally among all elements coupled in parallel. As a result of these current imbalances, there are diminishing returns associated with connecting more individual through-hole/surface mount MOSFETs in parallel, since the safe operational margins need to be increased for each additional semiconductor element added in parallel.

Another disadvantage of traditional DC output SSCs employing through-hole/surface mount semiconductor packages relates to overall reliability during manufacturing and design. With through-hole/surface mount semiconductor package usage, components could degrade due to repeated high temperature events during the DBC bonding, and soldering in the manufacturing process. The increased use of soldering for installing through-hole/surface mount components also increases the likelihood of soldering joint fail due to fatigue, and stress associated with constant high current and/or high temperature operations. The most significant reliability issue relates to the fact that traditional DC output SSCs may require more than half-a-dozen through-hole/surface mount MOSFETs connected in parallel for reliably switching ≥200 ADC. It should be noted, the larger the number of individual semiconductor elements used in an array, the higher the probability of failures. This is because the failure of a single semiconductor element in the array has an instantaneous impact on the power distribution of rest of the elements, often triggering cascading failures of the other units within the group, and ultimately rendering the DC output SSC inoperable.

For DC output SSCs, it is generally ideal to use semiconductor packages with higher individual performance. Naturally, the larger the semiconductor packaging, the better output characteristics including lead current rating, power dissipation, and thermal dissipation. However, larger packages such as chassis-mount power modules are less ideal from a control standpoint due to, for example, higher gate threshold voltage, and larger input capacitance. Thus, the control circuitry of DC output SSC utilizing larger power module packages needs a better driving method in order to ensure proper DC switching operation.

SUMMARY OF PARTICULAR EMBODIMENTS

It will be appreciated by those skilled in the art that other variations of the embodiments described below may also be practiced without departing from the scope of the invention. It should be further noted that these embodiments, and other embodiments of the present invention will become more fully apparent from a review of the description and claims which follow.

In one embodiment of the present invention, a DC output solid state contactor includes the option to switch elements based on isolated power module semiconductor packages, namely SOT-227, and its variants denoted by different prefixes and suffixes, with higher per unit package ratings such as RMS output current capacity, and inherent electrical isolation from its baseplate. Components are coupled together within an enclosure to form an integrated panel mount design.

It is an object of the present invention to produce a DC output Solid State Contactor assembly 10 with higher continuous output current capabilities (e.g. >200 A).

It is another object of the present invention for the assembly 10 to have an integrated, robust and all mechanical construction.

It is an additional object of the present invention to offer better reliability through a design and construction with power module packages including eliminating additional high temperature bonding and soldering events during manufacturing, minimizing gate parasitic inductance, and increasing RMS current capacity.

It is an additional object of the present invention to utilize an improved drive circuitry in order to ensure proper operation of larger power module semiconductors whether it's of IGBT, MOSFET, SicMOSFET, or other semiconductor technology.

In accordance with the objects and those that will be mentioned and will become apparent below: Briefly, in one embodiment of the present invention, the novel DC output SSC assembly 10 is a solid state contactor including a plurality of current carrying power terminals, each for connecting to the "hot side" or "low potential side" of a circuit. Based on a user input control signal, the SSC functions to permit the flow of DC current in the respective power terminals or other functions to interrupt the flow of current in the respective power terminals. In one embodiment of the present invention, each SSC assembly 10 includes one or more isolated power module(s) that can be of an IGBT, a MOSFET, SiC MOSFET or other suitable semiconductor type. In one embodiment of the present invention, the switching semiconductors(s) are of power module packages, namely SOT-227 and its variants that can be in a single element configuration or two or more elements connected in series or parallel. In one embodiment of the present invention, an improved drive circuitry is attached directly onto at least one of the power module(s), and coupling to the gate electrodes of at least one of the power module(s). In one embodiment of the present invention, the drive circuitry includes a control input, a voltage priming system, a control circuit, a status and gate impulse outputs. The drive circuitry converts user control input signals into a gate impulse voltage, thereby changing the conduction state of the power modules effectively "opening" or "closing" the switch. In one embodiment of the present invention, the entire assembly 10 is housed in an enclosure having a baseplate that attaches to one of more components of the SSC assembly 10. In one embodiment of the present invention, the assembly 10 also allows the integration of additional safety elements, such as an internal transient suppression component, and insulated barriers.

BRIEF DESCRIPTION OF THE DRAWINGS

Various aspects of at least one example are discussed below with reference to the accompanying figures, which are not intended to be drawn to scale. The figures are included to provide an illustration and a further understanding of the various aspects and examples, and are incorporated in and constitute a part of this specification, but are not intended as a definition of the limits of a particular example. The drawings, together with the remainder of the specification, serve to explain principles and operations of the described and claimed aspects and examples. In the figures, each identical or nearly identical component that is illustrated in various figures is represented by a like numeral. For purposes of clarity, not every component may be labeled in every figure. In the drawings:

DETAILED DESCRIPTION OF PARTICULAR EMBODIMENTS

Figure 1:
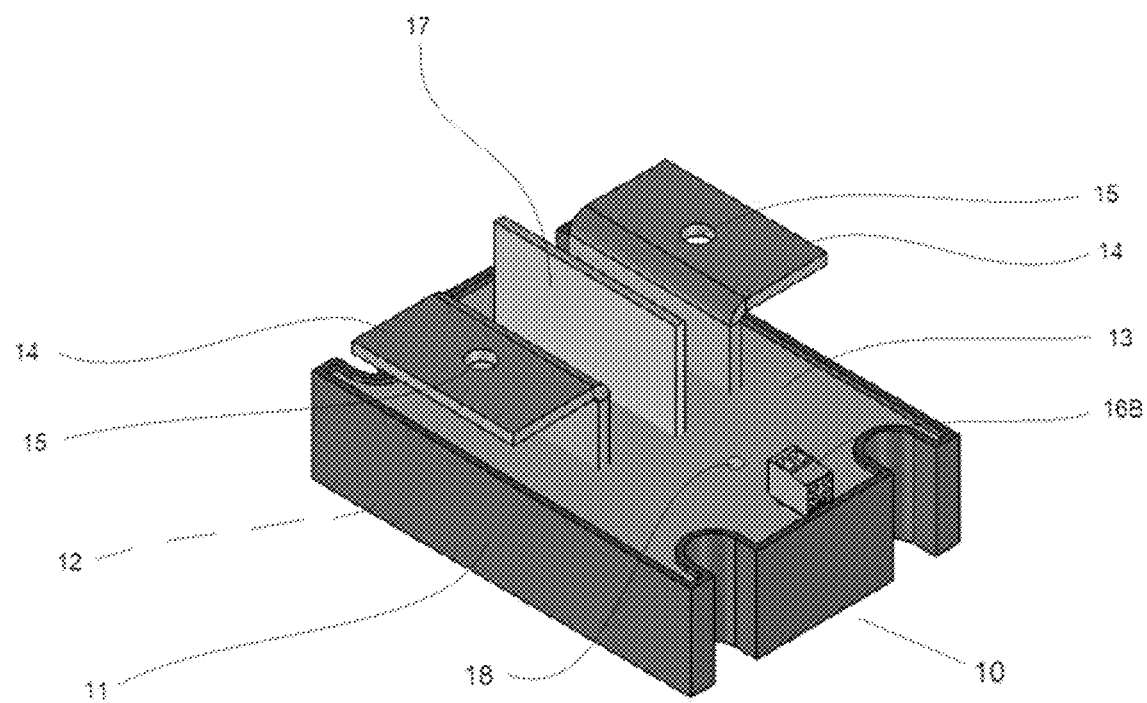
FIG. 1 is a perspective view of a DC output solid state contactor assembly 10 in accordance with one embodiment.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

References in the specification to "one embodiment", "an embodiment", "a preferred embodiment", "an alternative embodiment", "embodiments", "variations", "a variation" and similar phrases mean that a particular feature, structure, or characteristic described in connection with the embodiment(s) or variation(s) is included in at least an embodiment or variation of the invention. The appearances of the phrase "in one embodiment" or "in one variation" in various places in the specification are not necessarily all referring to the same embodiment or variation.

The terms "couple", "coupled", "connected", "joined", "attached" or "fixed" as used in this specification and the appended claims refer to either an indirect or direct connection between the identified elements, components or objects. Often the manner of the coupling will be related specifically to the manner in which the two coupled elements interact.

The term "or" as used in this specification and appended claims is not meant to be exclusive, but rather the term is inclusive meaning "either or both".

Referring to FIG. 1, in the embodiment shown, a high current DC output SSC assembly 10 is contained in a panel mount housing, which, for example, could take the form of an industry standard large puck style enclosure, or other shaped enclosure 11. In the embodiment shown, the entire assembly 10 is affixed on a baseplate 12, with internal components other than input and output terminals encapsulated in epoxy resin or other suitable composition 13. In one example a potting compound such as urethane could be used, or other composition which confers structural rigidity, chemical resistance, physical resistance and electrical isolation. The epoxy resin 13 in this embodiment formed within the enclosure is classified as less thermally conductive, e.g. <0.7 W/(m·K), and non-electrically conductive. Reduced thermal conductivity of the epoxy layer reduces heat transfer from the baseplate 12 to the drive circuit board 205, thus improving the reliability of electronic components on it.

The assembly 10 includes a control input termination 16B, enabling the user to supply a control signal voltage to command a change in the conduction state of the internal semiconductor element(s), which in turn "open" or "close" the electrical circuit the SSC is connected to. In this embodiment, the SSC electrically connects to a load via connection to a suitable power distribution device. Shown in FIG. 1 is a busbar type termination connection 14, where the circuit is connected via external ports 15. In one embodiment, the external ports 15 are disposed on a surface parallel to the entire assembly, so as to enable easy series or parallel connection of multiple assemblies with external busbars. The connected load is turned ON or OFF by "closing" or "opening" the SSC, respectively. This is achieved by using the user's control input voltage supplied at terminal 16B to change the conduction state of the internal semiconductor components. In this embodiment, the user control input action is indicated by an LED status indicator 18. Also featured in the embodiment shown is an electrically insulated barrier 17 with a surface across the length of the busbar terminations 14. The insulated barrier 17 is affixed in place by the hardened encapsulating compound, and it functions as a safety measure to reinforce isolation and prevent a cross-connection short circuit risk due foreign objects or debris in high voltage applications. Barrier 17 can be composed of any rigid insulator, with enough thickness to provide physical durability and electrical isolation greater than or equal to the rated isolation voltage of the device. In the embodiment shown, the insulated barrier in this embodiment has a cross section of an inverted "T" shape allowing it to be freely standing, however, this cross-section could be any suitable shape or configuration.

Figure 2:
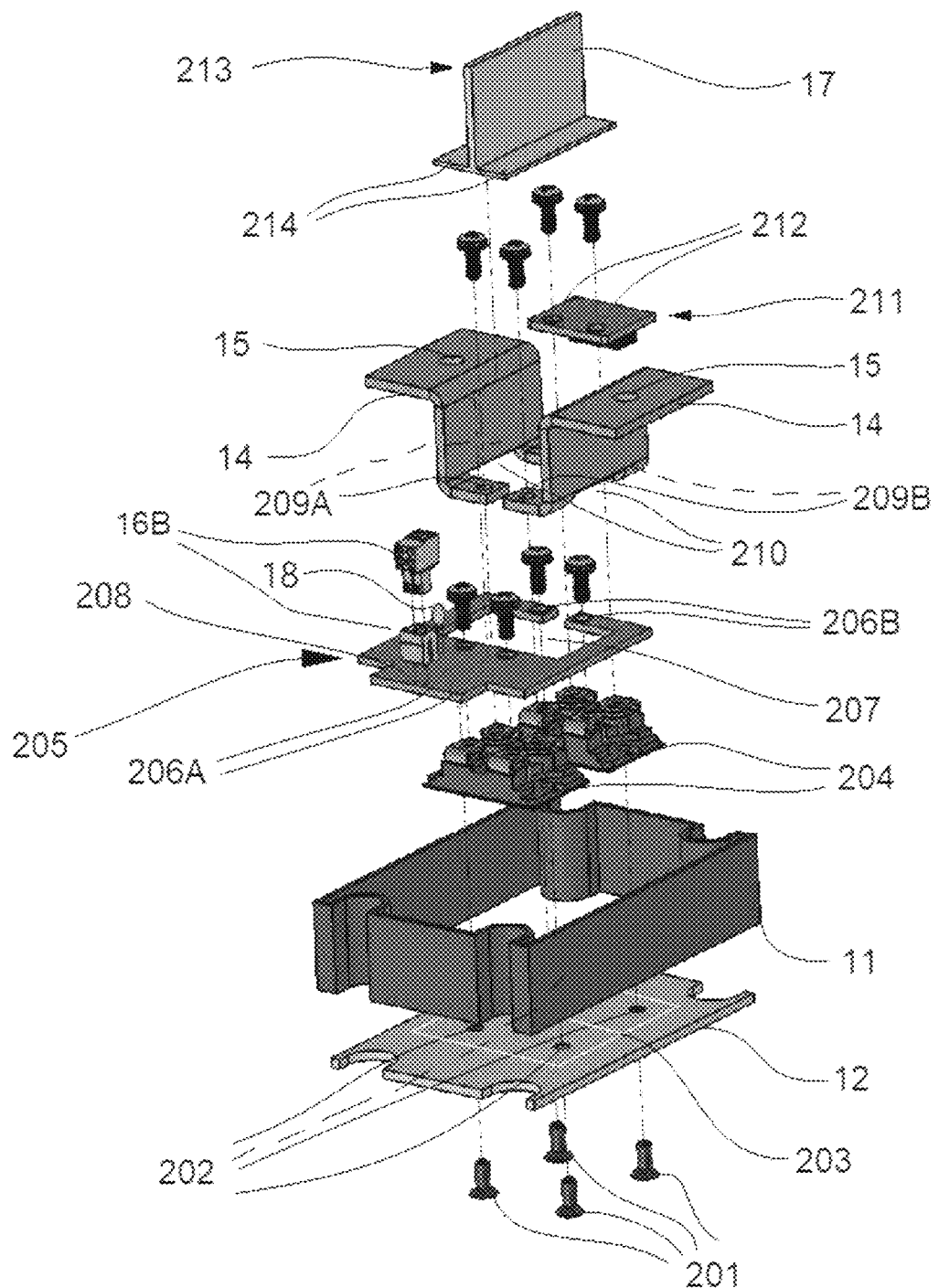
FIG. 2 is an exploded perspective view of the assembly 10 of FIG. 1 in accordance with one embodiment.
Figure 6:
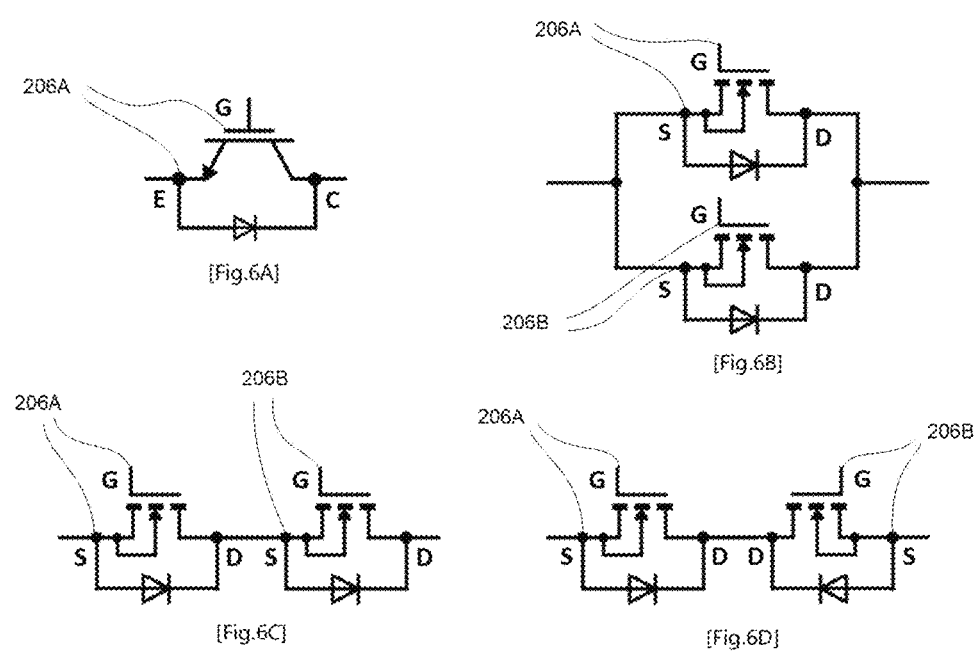
FIG. 6 is a schematic diagram showing example configurations of the isolated power module(s) in accordance with one embodiment.

Referring next to FIG. 2, all points of mechanical and electrical coupling within the assembly 10 are shown, in accordance with one embodiment of the present invention. This embodiment includes an SSC assembly 10 with two isolated MOSFET SOT-227 power modules 204 connected in parallel. It should be noted that various combinations of power modules and configurations thereof are possible, namely, series and anti-series as illustrated in FIG. 6.

Still referring to FIG. 2, on the baseplate 12, countersink holes 202 are tapped to mechanically fix the two power modules 204 in place. A solid die-cut thermal interface material or compound 203 can be applied on the baseplate to ensure effective heat transfer between the base of the modules 204 and the baseplate 12, which may be in further thermal contact with external heatsinks or cooling surfaces. The thermal interface material is ≤1 mm thick with thermal conductivity ≥1 w/m·k and can be made with either conductive, or non-conductive, silicone-based material. All three components, namely, the baseplate 12, thermal interface material 203, and modules 204, are mechanically coupled together by countersink screws 201 or other suitable attachment means. In the embodiment shown, screws 201 are placed in such way that they ensure that the bottom surface of the baseplate 12 remains flat so that the SSC assembly 10 base may be mounted flush with external surfaces. Each of the modules 204 in the embodiment shown has two sets of terminals corresponding to the Gate and the Source (gate electrodes), and the Drain and the Source (output side). Both modules 204 are oriented in the same direction in this embodiment, enabling their terminals to be easily connected in parallel to increase current handling capabilities.

In one embodiment of the present invention, the drive circuit board 205 is of a "die-cut" or similar shape 207. This shape allows the drive circuit board 205 to be integrated within the confined space of the enclosure 11, while also ensuring electrical coupling is possible from the board 205 to the gate electrodes of all modules 204. The "die-cut" shape 207 also ensures electrical clearance between the drive circuit board 205 and the power terminals of all modules 204 within the assembly 10.

In one embodiment, the drive circuit board 205 has points of electrical input 208 for accepting the user's control input signal. In order for the user to connect external control input wires, this embodiment uses a 2-position terminal block 16B which electrically couples to input 208, while also protruding out of the epoxy layer allowing external connections to be made. In this embodiment, drive circuit board 205 has two pairs of output terminations (206A and 206B) for delivering corresponding gate impulses to the gate electrodes of each of the two modules in parallel. The primary gate impulse output 206A and secondary impulse output at 206B are on the same physical structure of the drive circuit board 205 in this embodiment. This enables convenient mechanical and electrical coupling to the gate electrodes of each of the modules 204.

In one embodiment, both outputs 206A and 206B deliver simultaneous gate impulses to each of the two modules 204 coupled in parallel, changing the conduction state of both modules 204 simultaneously. The use of a conductive structure via circuit board, as shown, minimizes inductance, and reduces possibility of gate oscillation.

In the embodiment shown, the output 206A couples to the gate electrode of the nearest module 204, and output 206B couples to the gate electrode of the second module 204. In a larger panel mount enclosure with more semiconductors of the same form factor, it is conceivable that the structure and coupling to the gate electrodes of additional modules 206B repeats for the additional semiconductor elements down the line.

In the embodiment shown, the electrically conductive power terminals coupling the output side semiconductor terminals to the load side are indicated by reference numeral 14. In this embodiment, the power terminals are in the form of busbars with sufficient thickness and ampacity for the continuous RMS current of the DC output SSC.

Each busbar 14 of the embodiment has a cutout space 210 that ensures a safe electrical clearance over parts of the integrated drive circuit board 205. Both busbars vertically clear the wall of enclosure 11.

In one embodiment of the present invention, one busbar 14 mechanically and electrically couples to the source electrodes 209A of each of the modules 204. The other busbar 14 mechanically and electrically couples to the drain terminals 209B of each of the modules 204.

In one embodiment, a transient suppression device of RC snubber 211 is added to the assembly 10. The RC snubber 211 electrically and mechanically couples at ports 212 across both busbars 14, such that both modules 204 and the RC snubber 211 are coupled together in parallel.

In the embodiment shown, the space between the pair of busbars 14 also includes an electrical insulated barrier 17 having surfaces 214 parallel to the baseplate on each side facing each busbar 14. The barrier 17 is freely standing and physically fixed in place after the epoxy resin 13 hardens.

Figure 3:
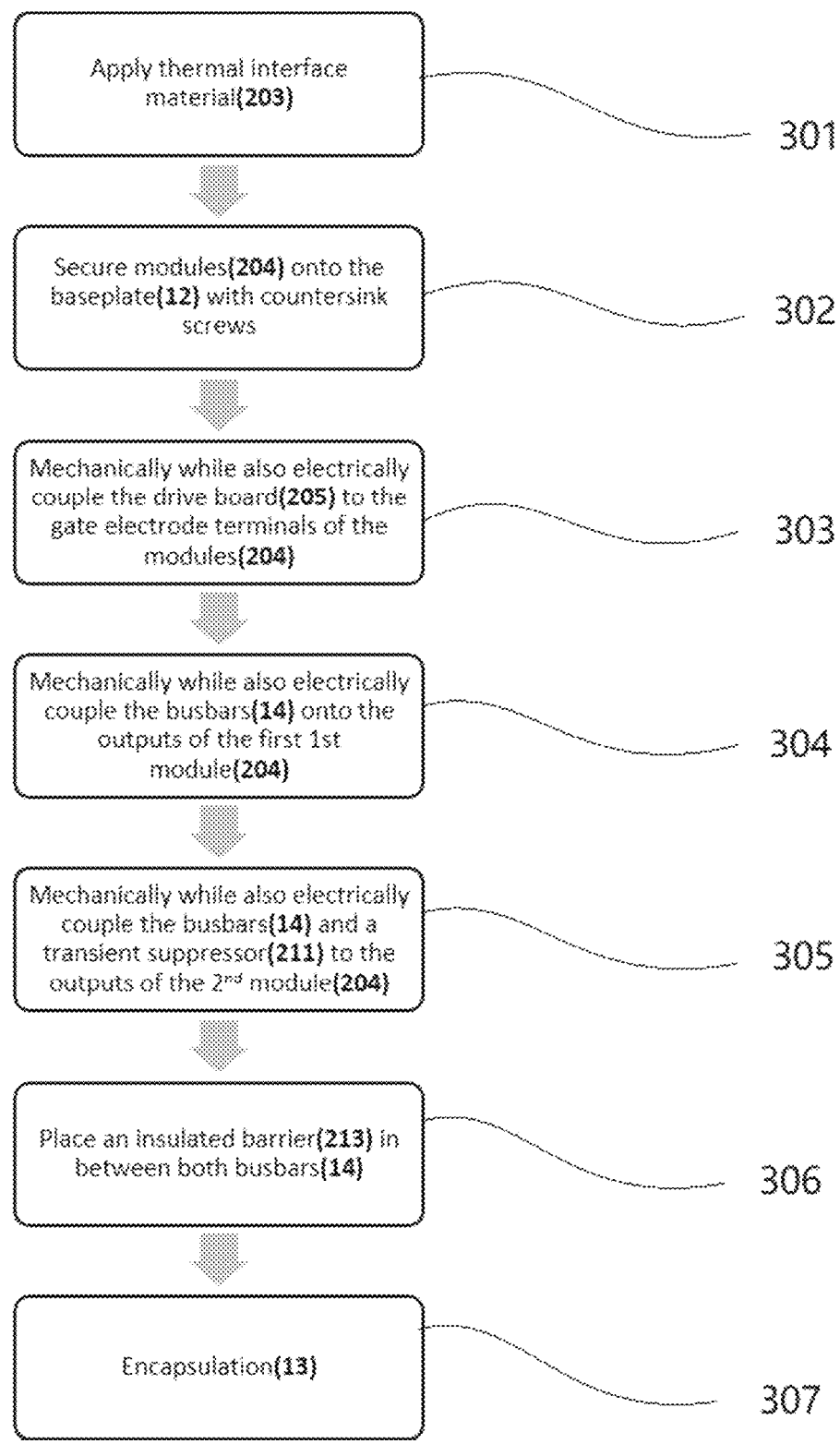
FIG. 3 is a flow diagram outlining a method for assembling the assembly 10 of FIG. 1.

Referring next to FIG. 3, the flow diagram illustrates one method of assembling a preferred embodiment of the present invention. The process begins at step 301, wherein a layer of thermal interface material 203 is applied onto the baseplate 12. Next in process step 302, both modules 204 are secured onto the baseplate 12 with the thermal interface material 203 between both contacting surfaces. Modules 14 and base plate 12 are secured by countersink screws attached to the baseplate 12. Process step 303 involves mechanically and electrically coupling the drive circuit board to the input side of both modules 204 with screws or other suitable attachment means. In process step 304, busbar pair 14 is mechanically and electrically coupled to the output terminals of the first module with screws or other suitable attachment means.

Still referring to FIG. 3, the process is repeated for the second module. However, this time the screws (or other attachment means) also couples an additional RC snubber component. Process step 305 involves placing a free-standing electrical insulator barrier in between the power distribution devices. In the last step 306 of this embodiment, the entire SSC assembly 10 is encapsulated in epoxy resin, or other suitable material, which embeds and fixes all of the internal components in place once the epoxy hardens. This also secures the insulated barrier 213 in place.

Figure 4:
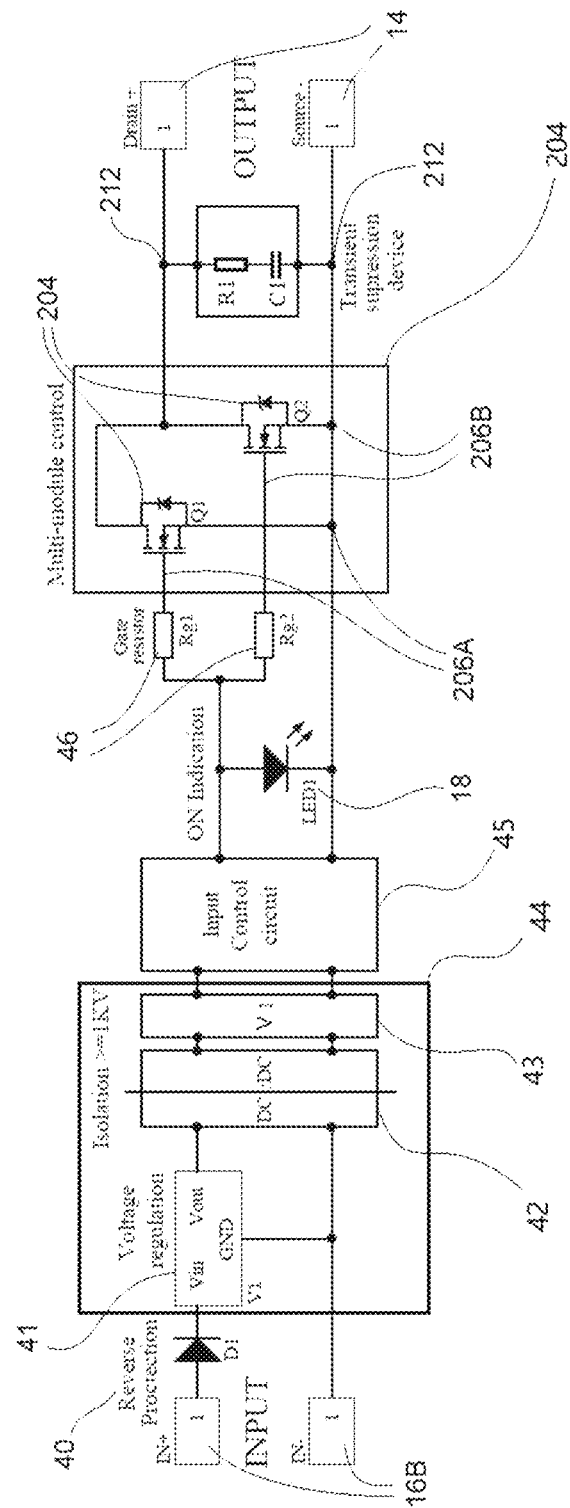
FIG. 4 is a schematic diagram illustrating an example drive circuitry for the assembly 10 of FIG. 1 in accordance with one embodiment.

Referring next to FIG. 4, FIG. 4 is a schematic drawing which illustrates a new and improved drive circuitry for controlling isolated power modules in accordance with one embodiment of the present invention. In this embodiment, the drive circuitry is used to simultaneously control two N-Channel MOSFET modules 204 functioning in parallel. In this embodiment, the drive circuitry converts the user control input signal into two simultaneous gate impulse voltages, to be received by each of the modules 204. Upon receiving the gate impulse, each of the modules changes to a conducting state, effectively closing the circuit.

FIG. 4 illustrates an example process of the SSC assembly 10 functioning as a Single Pole Single Throw ("SPST") switch, and is a normally open switch, in accordance with this embodiment.

As described herein, in one embodiment, the drive circuitry of the present invention uses voltage priming process 44. The first step of process 44 is to ensure that the DC control voltage supplied by the user at 16B has the correct polarity. Thus, a polarity diode 40 is connected in series either at the positive or the negative control input side as a standard procedure. In one embodiment of a present invention that allows a control input voltage of up to 32 Vdc, a reverse blocking voltage is typically 40 Vdc or more.

Next the drive circuitry undergoes a voltage priming process 44 consisting of regulating, isolating and further converting the input voltage to gate impulses that are then delivered to the gates of power modules 204. Regulation 41 allows a wide range of user's control input voltages to be regulated accurately to a set voltage threshold typically within ±1V. In a preferred embodiment with a rated user control input voltage of 5-32 Vdc, the regulation is set to 5 Vdc This regulation in 41 may be achieved by using discrete devices such as voltage regulators or IC components such as linear regulator replacements. This set regulated-voltage-threshold can be of any reasonable voltage, as long as it corresponds to the user's input voltage range, while also working in tandem with the following process of DC/DC isolation 42 and further DC/DC conversion 43.

The DC/DC isolation process 42 provides required electrical isolation between both the input and output voltage. In one embodiment, this step is achieved by use of a DC/DC converter which provides electrical isolation of >1000 VAC.

The last process as part of the initial voltage priming procedure 44 in accordance with one embodiment of the present invention is a DC/DC conversion process 43 to ensure that the voltage to be utilized by the control circuit 45 is at an optimally high level. After regulation 41 and isolation 42, the resulting voltage is at about 5 Vdc in this embodiment. The voltage DC/DC conversion process 43, in this case, converts 5 Vdc to a higher voltage of 14 Vdc, before the voltage is sent into the control circuit. However, the DC/DC conversion process 43 may result in voltages other than 14 Vdc, as long as the voltage is sufficiently high enough for power module(s) of the assembly 10 to enter an optimal conduction state. It should be noted that regulation 41, DC/DC isolation 42 and DC/DC conversion 43 of voltage priming procedure 44 may occur in any order achieved with either a single integrated IC component, such as an isolated DC/DC converter module, or via separate IC components. The voltage priming process 44 will enable the driving of power module semiconductors which often cannot rely on driving methods currently used for smaller through-hole/surface mount semiconductor packages incorporating a photodiode array output optocoupler.

After the control circuitry 45 generates an optimal voltage level as the result of process 43, it produces one or more outputs in the form of a gate impulse voltage, which can then be selectively delivered to the gate electrodes of each module within the assembly 10, based on set logic and or other conditions, to change their respective states of conduction. In this embodiment, the output gate impulse voltage is simultaneously delivered to the separate gate resistor 45 of both MOSFETs, effectively turning on or off both transistors at the same time since both MOSFETs' gate electrodes are coupled to 206A and 206B in the embodiment of the control circuit.

In this embodiment, with both MOSFET modules entering a conduction state by receiving their gate impulses, a current flows between the drains and the sources of both MOSFET modules. The user's electrical circuit coupled to the SSC assembly's power terminals 14 are effectively turned ON or OFF by this operation. In this embodiment, there is also a transient suppression device, an RC snubber circuit, coupled to output power terminals 14, which in turn is coupled to the drains and the sources of all MOSFET modules connected in parallel in this embodiment. This transient suppression device 211 may also be a diode, MOV, or the like.

Figure 5:
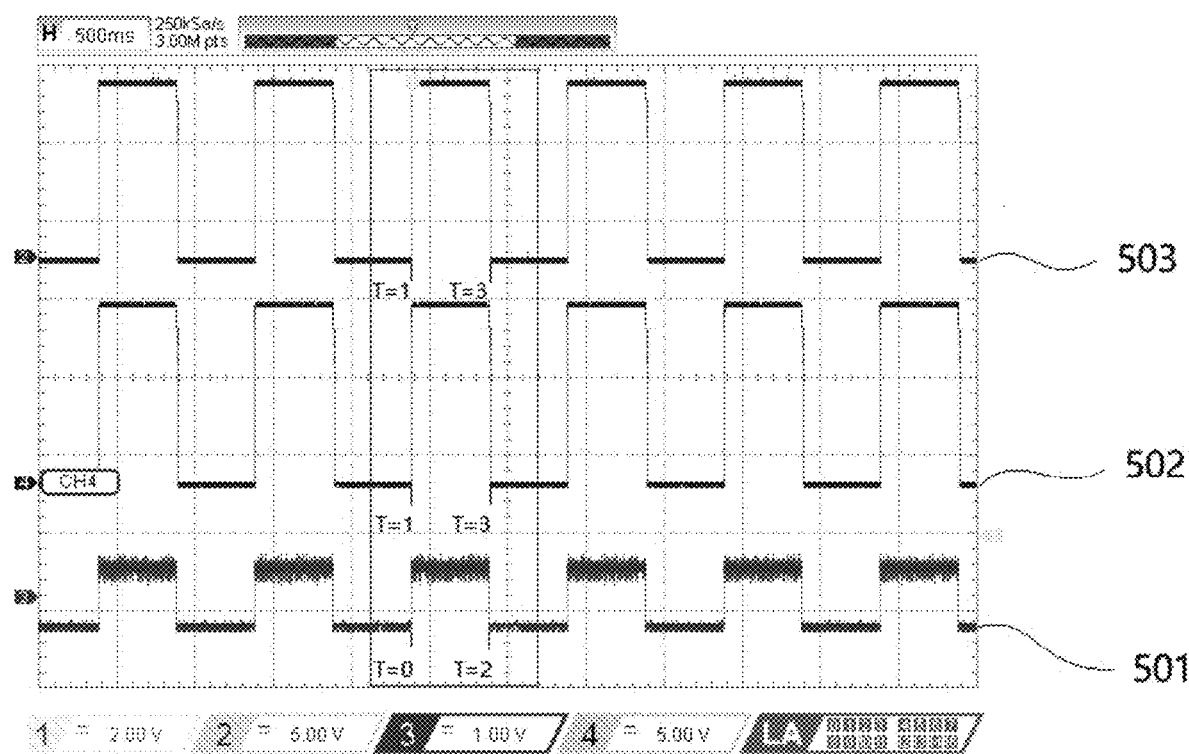
FIG. 5 is a chart illustrating the operating characteristics of the drive circuitry illustrated in FIG. 4, in accordance with one embodiment.

Referring next to FIG. 5, the chart shows circuit waveforms in an embodiment of the present invention demonstrating the relationship between user control input and the output gate impulse generated by the new and improved drive circuit board 205. Waveform 501 shows a control input signal applied at terminal 16B. Waveform 502 shows the gate impulse voltage at output 206A sent to the gate electrode of the first MOSFET connected in parallel. Waveform 503 shows the gate impulse voltage at output 206B sent to the gate electrode of the second MOSFET module of the terminals 14.

Examining the waveforms that occurred in a single cycle of the preferred embodiment, before T=0, the drive circuitry does not receive a control voltage input and remains at 0V. As a result, before T=0, there is no gate impulse voltage produced at output 206A or 206B, and both MOSFET modules remain non-conducting. At T=0, a control input voltage of 4.5 Vdc is applied to the terminals 16B. After this voltage is treated by a priming process 43 and then sent through the control circuit, at T=1, an output gate impulse voltage of 13.5 Vdc is generated at both outputs 206A and 206B. Output 206A is coupled to the gate and the source of the first MOSFET module, and output 206B is coupled to the gate and the source of the second MOSFET module. When a sufficiently high gate impulse voltage of 13.5 Vdc is received at the gate electrodes of both MOSFET modules simultaneously change to a conducting state, thereby closing the switch and allowing current to flow. At T=2, the user no longer supplies a control input voltage. As a result of this change, at T=3, both gate impulses drop to 0 Vdc again, and both MOSFET modules in this embodiment are no longer in a conducting state.

Referring next to FIG. 6, the drawing illustrates various types of semiconductor configurations that can be controlled by the drive circuit board 205 for performing switching in the DC output SSC assembly 10 in accordance with one embodiment of the present invention. In every case, all of the individual power modules are controlled by the common drive circuit board 205 that can selectively deliver gate impulses to the gate electrodes of each of the power modules within the assembly 10 and change their states of conduction, based on a set logic and or condition, simultaneously or otherwise. It should be noted there is no limit to the maximum number of modules that can be connected in series or parallel. The provided illustration of different embodiments demonstrates parallel and series connection with just two modules.

FIG. 6A illustrates a stand-alone configuration involving just one power module, in accordance with one embodiment of the present invention. In this embodiment, a single IGBT module is controlled by a gate impulse from output 206A.

FIG. 6B illustrates a parallel configuration of two power modules, in accordance with one embodiment of the present invention. In this configuration, two MOSFET modules are connected in parallel to share current, and each module receives its gate impulses simultaneously at its own gate electrode, respectively from output 206A and 206B.

FIG. 6C illustrates a series-aiding configuration of two power modules, in accordance with one embodiment of the present invention. In this configuration, two MOSFET modules are connected in series in the assembly 10 to increase voltage. Each module is controlled by simultaneous gate impulses received at its own gate electrode, from output 206A and 206B respectively.

FIG. 6D illustrates a series-opposing configuration of two power modules, in accordance with one embodiment of the present invention. In this configuration, two MOSFET modules are connected in anti-series to enable current flow in both directions. In this case, each module is controlled by a gate impulse received at its respective gate electrode which may either be simultaneous, sequential or otherwise.

The DC output SSC assembly 10 disclosed herein offers improvements in areas of construction, performance and reliability over prior art devices. When fitted in an industry-standard panel mount enclosure, the novel DC output SSC assembly 10 can be rated for a continuous current of 400 Amp or greater.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any modification, combination or permutation of any of the components, elements, functions, operations, or steps described or illustrated anywhere herein that a person having ordinary skill in the art would comprehend. All such modifications, combinations and permutations are believed to be within the sphere and scope of the invention as defined by the claims appended hereto.

What is claimed is:

1. A DC output solid state contactor assembly comprising:
  i. at least one isolated semiconductor power module, the at least one power module having at least one supply lead connected thereto;
  ii. at least one drive circuit connected to at least one chassis mount power module, the at least one drive circuit having at least one positive control input connection and an at least one negative control input connection;
  iii. a plurality of load output power terminals, each of the plurality of load output power terminals for connecting to one of the at least one hot side of the circuit and one of the at least one low potential side of the circuit;
  iv. a plurality of input/output terminals, each of the plurality of input/output terminals electrically connected to the at least one drive circuit and at least one supply lead of the at least one isolated power module;
  v. a thermally conductive baseplate for conducting heat generated by the at least one isolated semiconductor power module to a panel mount surface; and
  vi. an insulation barrier positioned between each of the plurality of load output power terminals.

2. The assembly of claim 1 wherein the at least one isolated semiconductor power module is selected from an SOT-227 package and SOT-227 package variants.

3. The assembly of claim 1 where in the at least one isolated semiconductor power module is connected in a parallel or series configuration.

4. The assembly of claim 1 wherein the assembly is enclosed in a housing.

5. The assembly of claim 4 wherein the housing is a panel-mount housing.

6. The assembly of claim 1 wherein the assembly is a mechanically coupled assembly encapsulated in an epoxy resin.

7. The assembly of claim 1 wherein each of the at least isolated semiconductor power modules is mechanically secured to the baseplate.

8. The assembly of claim 1 wherein the at least one drive circuit includes at least one isolated DC/DC converter module.

9. The assembly of claim 1 wherein each of the at least one isolated semiconductor power modules has an inherent package electrical insulation voltage of ≥1000 VAC.

10. The assembly of claim 8 wherein the isolated DC/DC converter module provides input/output isolation of ≥1000 VAC.

11. The assembly of claim 1 wherein each of the plurality of busbars is of a uniform construction having an elongated body member terminating in two vertical sidewalls at each end thereof, and horizontal flanges disposed at a distal end of each sidewall.

12. The assembly of claim 1 wherein each of the plurality of busbars has a supporting body member which bends at least once before extending vertically to clear an enclosure wall, thereby forming a cross-section with a flat upper surface for facilitating hot or low potential side power connections.

13. The assembly of claim 1 wherein the at least one drive circuit includes at least one linear regulator for regulating a voltage before the voltage passes to a control input circuit.

14. A DC output solid state contactor assembly comprising:
  i. at least one isolated semiconductor power module, the at least one power module having at least one supply lead connected thereto;
  ii. at least one drive circuit connected to at least one chassis mount power module, the at least one drive circuit having at least one positive control input connection and an at least one negative control input connection;
  iii. a plurality of load output power terminals, each of the plurality of load output power terminals for connecting to one of the at least one hot side of the circuit and one of the at least one low potential side of the circuit;

iv. a plurality of input/output terminals, each of the plurality of input/output terminals electrically connected to the at least one drive circuit and at least one supply lead of the at least one isolated power module;

v. a thermally conductive baseplate for conducting heat generated by the at least one isolated semiconductor power module to a panel mount surface;

wherein each of the plurality of load output power terminals coupling the load output is a busbar.

15. The assembly of claim 14 wherein each of the plurality of busbars has a supporting body member which bends at least once before extending vertically to clear an enclosure wall, thereby forming a cross-section with a flat upper surface for facilitating hot or low potential side power connections.

16. The assembly of claim 14 further comprising an insulation barrier positioned between each of the plurality of load output power terminals.

* * * * *